(12) United States Patent
Nakamura

(10) Patent No.: US 8,742,865 B2
(45) Date of Patent: Jun. 3, 2014

(54) POLAR MODULATION TRANSMISSION CIRCUIT AND POLAR MODULATION TRANSMISSION METHOD

(75) Inventor: Maki Nakamura, Kanagawa (JP)

(73) Assignee: Paansonic Corporation, Osaka (JP)

( * ) Notice: Subject to any disclaimer, the term of this patent is extended or adjusted under 35 U.S.C. 154(b) by 226 days.

(21) Appl. No.: 13/382,449

(22) PCT Filed: Jun. 22, 2010

(86) PCT No.: PCT/JP2010/004143
§ 371 (c)(1),
(2), (4) Date: Jan. 5, 2012

(87) PCT Pub. No.: WO2011/004557
PCT Pub. Date: Jan. 13, 2011

(65) Prior Publication Data
US 2012/0112847 A1    May 10, 2012

(30) Foreign Application Priority Data

Jul. 7, 2009 (JP) .................... 2009-161149

(51) Int. Cl.
*H03C 1/50*    (2006.01)
(52) U.S. Cl.
USPC ........................................ 332/145; 332/151
(58) Field of Classification Search
USPC ......... 332/145, 151; 375/300; 455/108, 127.2
See application file for complete search history.

(56) References Cited

U.S. PATENT DOCUMENTS

| | | | |
|---|---|---|---|
| 8,050,637 | B2 | 11/2011 | Shimizu et al. |
| 2006/0009169 | A1 | 1/2006 | Arayashiki |
| 2006/0234652 | A1* | 10/2006 | Oka .............................. 455/102 |
| 2007/0009062 | A1* | 1/2007 | Matsuura et al. ............. 375/296 |
| 2008/0026706 | A1* | 1/2008 | Shimizu et al. ............... 455/108 |

FOREIGN PATENT DOCUMENTS

| | | |
|---|---|---|
| CN | 101390285 A | 3/2009 |
| JP | 2004-266351 A | 9/2004 |
| JP | 2005-150932 A | 6/2005 |
| JP | 2007-180782 A | 7/2007 |
| JP | 2007-274062 A | 10/2007 |
| JP | 2008-294518 A | 12/2008 |

OTHER PUBLICATIONS

International Search Report for PCT/JP2010/004143 dated Sep. 14, 2010.

* cited by examiner

*Primary Examiner* — Joseph Chang
*Assistant Examiner* — Jeffrey Shin
(74) *Attorney, Agent, or Firm* — Pearne & Gordon LLP

(57) ABSTRACT

Disclosed is a polar modulation transmission circuit wherein distortion components resulting from variations between individual amplifiers are compensated for with few man-hours, and deterioration in signal quality is effectively suppressed. A frequency converter (180) converts the frequency of an output signal of a high frequency power amplifier (170) and outputs a frequency domain signal, and a phase compensation unit (150) measures the power level, for each delay amount, at a low frequency band and high frequency band wherein the detuning frequency from the frequency domain signal is the same, calculates the "unlevel amount" (relative level difference) between the power level of the low frequency band and power level of the high frequency band for each delay amount, and determines the compensation characteristics on the basis of the relationship of the unlevel amount (relative level difference) to the delay amount. Then, the phase compensation unit (150) compensates for the phase signal by adding to the phase signal the phase compensation amount, in the determined compensation characteristics, that corresponds to the amplitude signal.

7 Claims, 15 Drawing Sheets

POLAR MODULATION TRANSMISSION CIRCUIT AND POLAR MODULATION TRANSMISSION METHOD

TECHNICAL FIELD

The present invention relates to a transmission circuit and a transmission method, which are used in communication devices such as a mobile phone and a wireless LAN, particularly to a polar modulation transmission circuit and a polar modulation transmission method for performing compensation to a phase.

BACKGROUND ART

In design of the conventional transmission apparatus, generally there is a trade-off relationship between efficiency and linearity. However, in the transmitting apparatus, recently there is proposed a technology in which a balance between the high efficiency and the linearity can be established using polar modulation.

As to the conventional polar modulation transmission circuit, for example, Patent Literature 1 discloses a transmission circuit. FIG. 1 is a block diagram illustrating an example of a configuration of conventional transmission circuit 10 disclosed in Patent Literature 1. In FIG. 1, conventional transmission circuit 10 includes amplitude/phase extraction section 11, phase modulation section 12, amplifier 13, output terminal 14, and amplitude control section 15.

Amplitude/phase extraction section 11 extracts an amplitude signal indicating an amplitude component (for example, $\sqrt{(I2+Q2)}$) and a phase signal indicating a phase component (for example, an angle formed by a modulation symbol and an I-axis) from input data. The amplitude signal is input to amplitude control section 15. Amplitude control section 15 supplies a voltage corresponding to the amplitude signal as a power supply voltage to amplifier 13. The phase signal is input to phase modulation section 12. Phase modulation section 12 performs phase modulation of a high-frequency signal based on the input phase signal, and outputs a phase modulation signal obtained by the phase modulation. The phase modulation signal is input to amplifier 13. Amplifier 13 amplifies the phase modulation signal according to the voltage supplied from amplitude control section 15. The signal amplified by amplifier 13 is output as a transmission signal from output terminal 14. An output level of the transmission signal can be controlled by changing an output voltage of amplitude control section 15 to be supplied to amplifier 13. A method in which the amplitude signal and the phase signal are separated from the input data to perform the modulation using the amplitude signal and the phase signal is called polar modulation or polar coordinate modulation. Transmission circuit 10 that performs the method is also called a polar modulation transmission circuit (or polar coordinate modulation transmission circuit).

In the polar modulation transmission circuit, there is known a distortion generated in amplifier 13. A relationship (AM-AM characteristic) between an output power and the power supply voltage corresponding to the amplitude signal is not linear in amplifier 13. Additionally, a relationship (AM-PM characteristic) between a phase deviation of input/output and the power supply voltage of amplifier 13 is not constant. Particularly, when the AM-PM characteristic changes, a shape of a spectrum of the output signal becomes asymmetry. As a result, radio performance such as an ACLR (Adjacent Channel Lockage Power Ratio) is degraded in a transmitter.

An influence of the AM-PM characteristic on the ACLR will be described below with reference to FIGS. 2 and 3. The AM-PM characteristic means a phase characteristic that changes according to power supply voltage Vcc of amplifier 13. FIG. 2 illustrates an example of a relationship between power supply voltage Vcc of amplifier 13 and passage phase Ph, namely, the AM-PM characteristic of amplifier 13. In FIG. 2, characteristic 21 indicates the ideal AM-PM characteristic, and characteristic 22 indicates the actual AM-PM characteristic. While the ideal AM-PM characteristic is flat, passage phase Ph varies according to power supply voltage Vcc of amplifier 13 in the actual AM-PM characteristic.

FIG. 3 illustrates an example of a spectrum when amplifier 13 has the AM-PM characteristic illustrated in FIG. 2. In FIG. 3, broken line 31 indicates the spectrum of the ideal AM-PM characteristic indicated by characteristic 21 of FIG. 2, and solid line 32 indicates the spectrum of the AM-PM characteristic when passage phase Ph varies according to power supply voltage Vcc as indicated by characteristic 22 of FIG. 2. When the AM-PM characteristic is not flat, the ACLR is degraded as illustrated in FIG. 3.

As described above, in the polar modulation transmission circuit, the relationship (AM-AM characteristic) between the power supply voltage of the amplifier and the output power and the relationship (AM-PM characteristic) between the power supply voltage and the phase deviation of the input/output are compensated in order to maintain quality of the transmission signal.

A pre-distortion distortion compensation method is known as a method for compensating a generated distortion component through such compensation (for example, see Patent Literature 2). In a polar modulation transmission circuit described in Patent Literature 2, the AM-AM characteristic and the AM-PM characteristic are previously acquired and stored in a distortion compensation processing circuit, and reverse characteristics of the AM-AM characteristic and the AM-PM characteristic are added to the amplitude signal and the phase signal. By this means, it is possible to compensate the characteristic degradation caused by the distortion generated in the amplifier.

CITATION LIST

Patent Literature

PTL 1
Japanese Patent Application Laid-Open No. 2004-266351
PTL 2
Japanese Patent Application Laid-Open No. 2007-180782

SUMMARY OF INVENTION

Technical Problem

However, in the high-frequency amplifier used in the actual polar modulation transmission circuit, the AM-AM characteristic and/or the AM-PM characteristic changes individually by an individual variation. Therefore, it is necessary to individually perform the distortion compensation in order to suppress the influence of the individual variation, which results in a problem in that a man-hour is increased. Particularly, it is necessary to provide a demodulator that demodulates the output signal in order to measure the AM-PM characteristic, which results in a problem in that a circuit scale is enlarged.

Additionally, when a temperature around the amplifier or the power supply voltage of the amplifier varies, the AM-AM characteristic and the AM-PM characteristic vary. However, when the characteristic variation is compensated in real time, it is necessary to insert a pilot signal in order to measure the change of the AM-PM characteristic. Therefore, it is difficult to compensate the characteristic variation in real time in a system that continuously transmits the signal.

An object of the present invention is to provide a polar modulation transmission circuit and a polar modulation transmission method, in which the distortion component caused by the individual variation of the amplifier can be compensated with the small man-hour to effectively suppress the degradation of the signal quality.

Solution to Problem

A polar modulation transmission circuit of the present invention includes: an extraction section that extracts an amplitude signal and a phase signal from a modulated signal to output the amplitude signal and the phase signal; an amplitude control section that outputs a voltage corresponding to the amplitude signal; a phase compensation section that performs phase compensation by operating on the phase signal with a phase compensation amount corresponding to the amplitude signal; a phase modulation section that performs phase modulation of a high-frequency signal using the phase signal to which the phase compensation is performed, and generates a phase modulation signal; an amplifying section that sets the voltage output from the amplitude control section as a power supply voltage, amplifies the phase modulation signal output from the phase modulation section, and outputs the amplified phase modulation signal; and a conversion section that performs a fast Fourier transform of the output signal of the amplifying section to output a frequency spectrum signal to the phase compensation section, wherein the phase compensation section, using the frequency spectrum signal, determines a compensation characteristic in order to compensate an amplitude-phase characteristic of the amplifying section, and determines the phase compensation amount corresponding to the amplitude signal in the determined compensation characteristic.

A polar modulation transmission method of the present invention includes: extracting an amplitude signal and a phase signal from a modulated signal; outputting a voltage corresponding to the amplitude signal as a power supply voltage to an amplifying section; performing phase compensation by operating on the phase signal with a phase compensation amount corresponding to the amplitude signal; performing phase modulation of a high-frequency signal using the phase signal to which the phase compensation is performed; generating a phase modulation signal; amplifying the phase modulation signal with the amplifying section; outputting the amplified phase modulation signal; performing a fast Fourier transform of the output signal of the amplifying section to output a frequency spectrum signal; determining a compensation characteristic in order to compensate an amplitude-phase characteristic of the amplifying section using the frequency spectrum signal; and determining the phase compensation amount corresponding to the amplitude signal in the determined compensation characteristic.

Advantageous Effects of Invention

According to the present invention, it is possible to compensate the distortion component caused by the individual variation of the amplifier, with the small man-hour, to effectively suppress the degradation of the signal quality.

DESCRIPTION OF EMBODIMENTS

Hereinafter, embodiments of the present invention, will be described with reference to the drawings.

(Embodiment 1)

Figure 1:
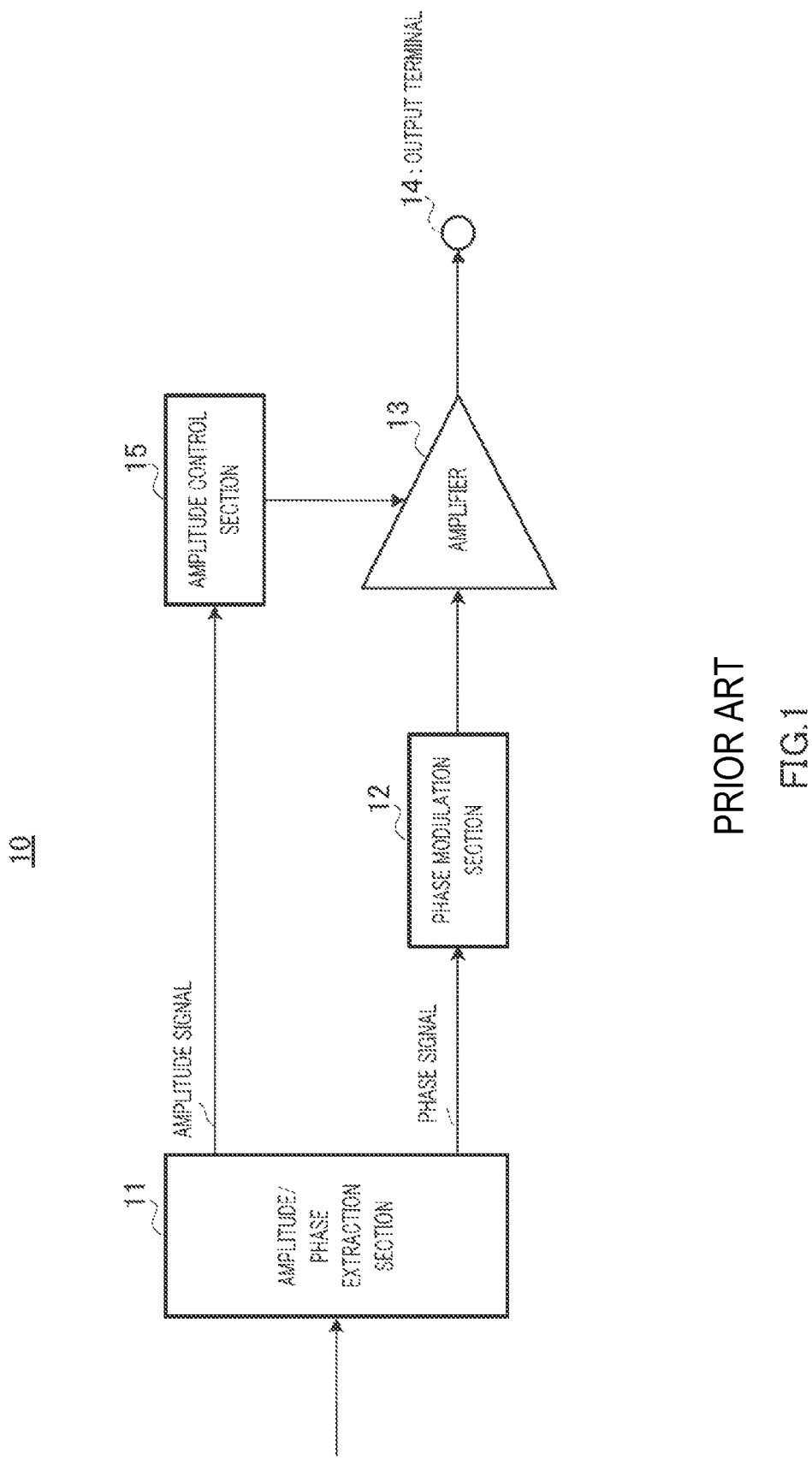
FIG. 1 is a view illustrating a configuration of a main part of a conventional polar modulation transmission circuit.
Figure 2:
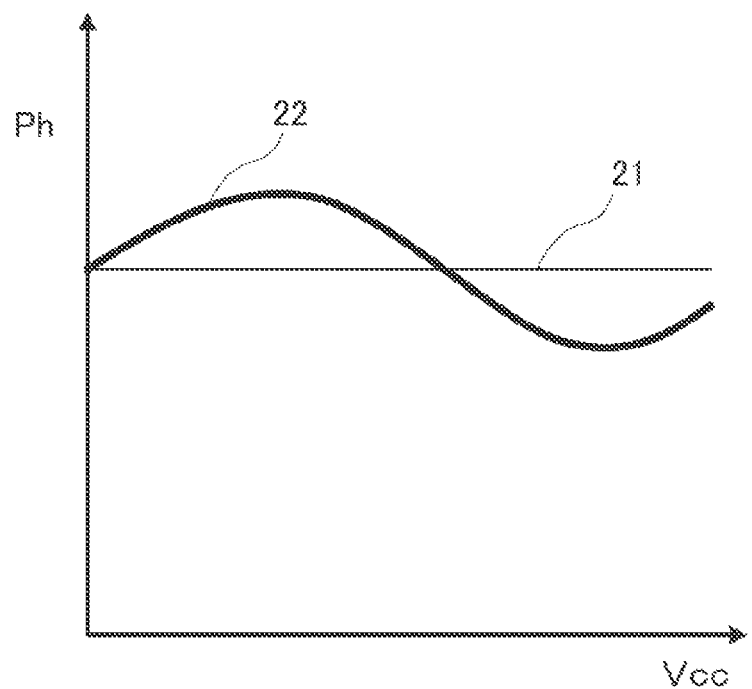
FIG. 2 is a view illustrating an example of an AM-PM characteristic.
Figure 3:
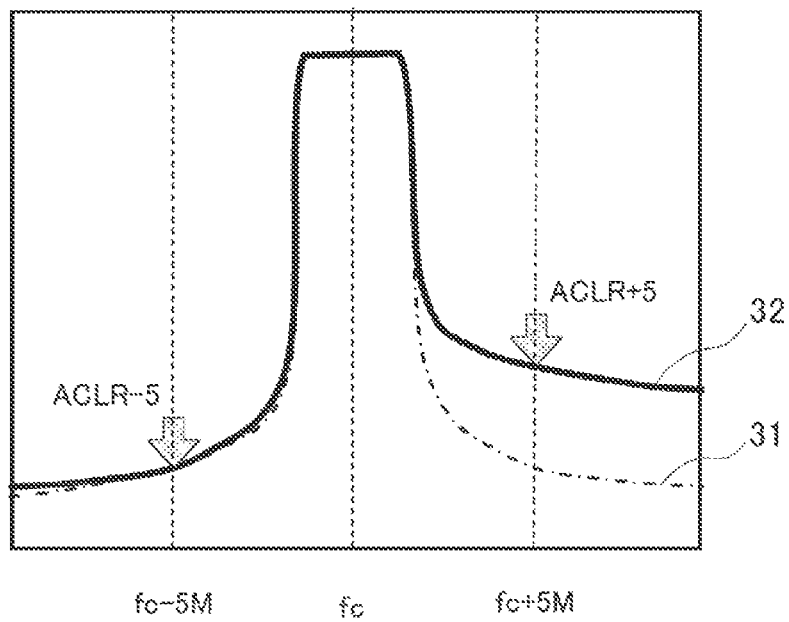
FIG. 3 is a view for explaining a relationship between the AM-PM characteristic and an ACLR.
Figure 4:
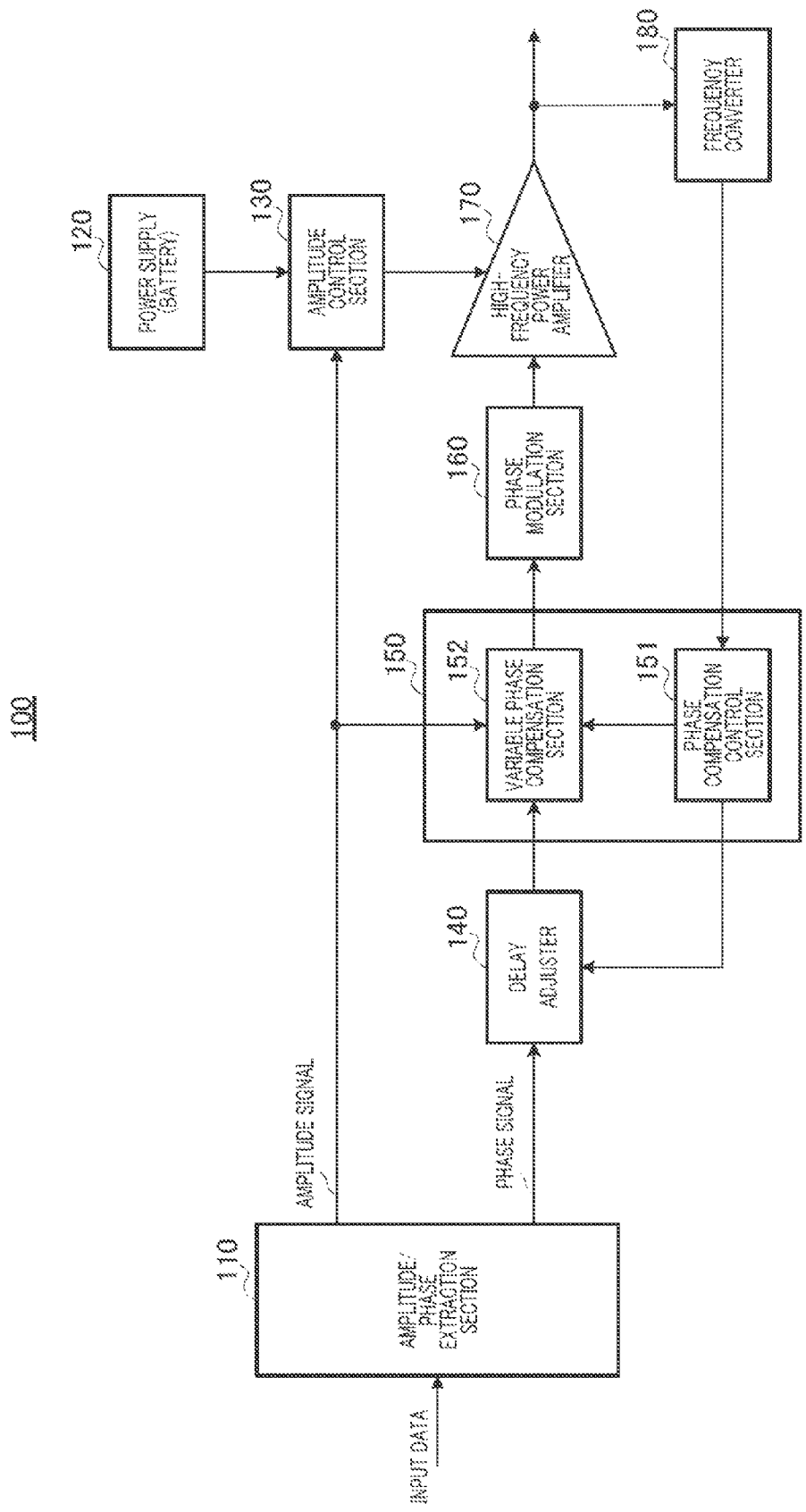
FIG. 4 is a view illustrating a configuration of a main part of a polar modulation transmission circuit according to Embodiment 1 of the present invention.

FIG. 4 illustrates a configuration of a main part of polar modulation transmission circuit (hereinafter simply referred to as a "transmission circuit") 100 according to the present embodiment of the present invention.

Amplitude/phase extraction section 110 inputs modulation data (hereinafter referred to as input data) as data to be transmitted, and extracts an amplitude signal r(t) and a phase signal φ(t) from the input data. Amplitude/phase extraction section 110 outputs the amplitude signal r(t) to amplitude control section 130 and variable phase compensation section 152 of phase compensation section 150. Amplitude/phase extraction section 110 outputs the phase signal φ(t) to delay adjuster 140.

Power supply (battery) 120 supplies a power supply voltage to amplitude control section 130.

Amplitude control section 130 biases the power supply voltage, which is supplied from power supply (battery) 120, according to the input amplitude signal r(t) and outputs a voltage corresponding to the input amplitude signal as power supply voltage Vcc to high-frequency power amplifier 170.

Delay adjuster 140 delays the input phase signal ϕ(t) based on a delay adjusting signal output from phase compensation control section 151 of phase compensation section 150, which is described below, and outputs the delayed phase signal ϕ(t) to variable phase compensation section 152 of phase compensation section 150.

Phase compensation section 150 includes phase compensation control section 151 and variable phase compensation section 152.

Phase compensation control section 151 outputs the delay adjusting signal to delay adjuster 140 in order to control a delay amount in delay adjuster 140. The delay adjusting signal is described later.

Using a signal (frequency spectrum signal) in a frequency domain of an output signal of high-frequency power amplifier 170, which is input from frequency converter 180 described below, phase compensation control section 151 generates a compensation characteristic signal in order to specify a compensation characteristic that compensates an AM-PM characteristic of high-frequency power amplifier 170. A method for generating the compensation characteristic signal in phase compensation control section 151 is described later. Phase compensation control section 151 outputs the compensation characteristic signal to variable phase compensation section 152.

Based on the compensation characteristic signal from phase compensation control section 151, variable phase compensation section 152 determines the compensation characteristic that compensates the AM-PM characteristic of high-frequency power amplifier 170. A method for determining the compensation characteristic in variable phase compensation section 152 is described later.

Variable phase compensation section 152 includes an adder therein. Variable phase compensation section 152 inputs the amplitude signal r(t), adds a phase compensation amount ϕr corresponding to the amplitude signal in the determined compensation characteristic to the phase signal ϕ(t) to perform phase compensation, and outputs a phase signal ϕ'(t) (=ϕ(t)+ϕr) of post-phase compensation to phase modulation section 160.

Phase modulation section 160 performs phase modulation of a high-frequency signal based on the phase signal ϕ'(t) of the post-phase compensation, and generates a phase modulation signal. Specifically, phase modulation section 160 generates a phase modulation signal (cos(2πfct+ϕ'(t))) having a carrier frequency fc by performing the phase modulation of the high-frequency signal having a frequency fc. Phase modulation section 160 outputs the phase modulation signal to high-frequency power amplifier 170.

High-frequency power amplifier 170 amplifies the phase modulation signal according to voltage Vcc supplied from amplitude control section 130.

Frequency converter 180 inputs the output signal of high-frequency power amplifier 170, performs a fast Fourier transform to the output signal to convert the output signal into the signal (frequency spectrum signal) in the frequency domain, and outputs the spectrum to phase compensation control section 151.

In an operation of transmission circuit 100 having the above configuration, operations of phase compensation control section 151 and variable phase compensation section 152 will mainly be described below.

As described above, the ACLR is degraded when high-frequency power amplifier 170 does not have the flat AM-PM characteristic. The AM-PM characteristic is a phase characteristic that varies according to power supply voltage Vcc of high-frequency power amplifier 170. Power supply voltage Vcc varies according to the amplitude signal r(t). In other words, the AM-PM characteristic is a gain characteristic that varies according to the amplitude signal r(t).

Furthermore, therefore, in the present embodiment, the AM-PM characteristic is previously compensated according to the amplitude signal r(t). In the present embodiment, in order to compensate a distortion component caused by an individual variation of high-frequency power amplifier 170, phase compensation control section 151 generates the compensation characteristic signal specifying the compensation characteristic that compensates the AM-PM characteristic of high-frequency power amplifier 170. Based on the compensation characteristic signal, variable phase compensation section 152 determines the compensation characteristic that compensates the AM-PM characteristic of high-frequency power amplifier 170. Variable phase compensation section 152 compensates the phase signal by adding the phase compensation amount corresponding to the amplitude signal in the compensation characteristic to the phase signal.

The method for generating the compensation characteristic signal in phase compensation control section 151 will be described.

Phase compensation control section 151 generates the delay adjusting signal in order to set the delay amount of delay adjuster 140 to at least two delay amounts different from each other, and outputs the generated delay adjusting signal to delay adjuster 140. Therefore, the delay amount of delay adjuster 140 is set to at least the two delay amounts different from each other.

When the delay amount of delay adjuster 140 is set to the two delay amounts, phase compensation control section 151 sets the delay amount to a first delay amount τ1 that is smaller than a delay amount τ0 (reference delay amount) and a second delay amount τ2 that is larger than the delay amount τ0 (τ1<τ0<τ2). As used herein, the delay amount means a time corresponding to a path difference between an AM path through which the amplitude signal travels from amplitude/phase extraction section 110 to high-frequency power amplifier 170 and a PM path through which the phase signal travels from amplitude/phase extraction section 110 to high-frequency power amplifier 170. The delay amount τ0 is a delay amount between the AM path and the PM path of transmission circuit 100, which are previously determined by a sample inspection.

The case in which phase compensation control section 151 sets the delay amount of delay adjuster 140 to the first delay amount τ1 and the second delay amount τ2 (τ1<τ0<τ2) to generate the compensation characteristic signal specifying the compensation characteristic that compensates the AM-PM characteristic of high-frequency power amplifier 170 will be described below.

Using the spectrum input from frequency converter 180, phase compensation control section 151 calculates power levels and imbalanced amounts (relative level difference) of a low-frequency band and a high-frequency band, which are separated from a carrier frequency fc onto a low-frequency side and a high-frequency side by the same mistuned frequency. A method for calculating the power level and the imbalanced amount in phase compensation control section 151 will be described below with reference to FIG. 5.

Figure 5A:
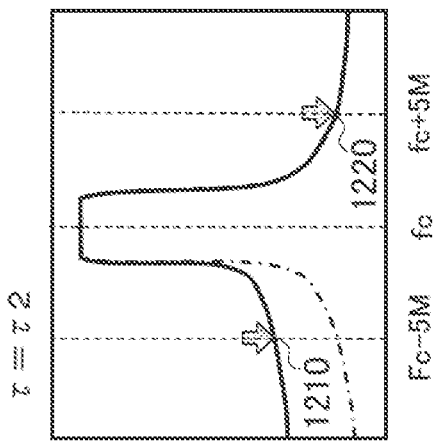
FIG. 5 is a view illustrating an example of a spectrum input from a frequency converter.
Figure 5B:
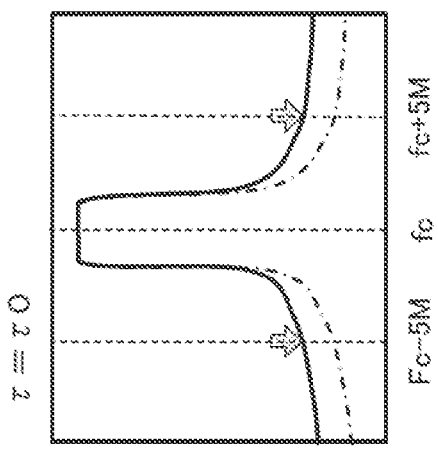
Figure 5C:
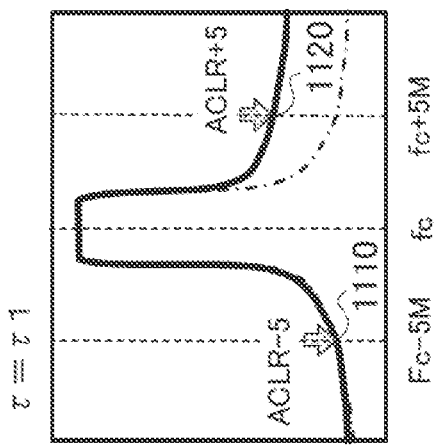

FIG. 5 is a view illustrating an example of the spectrum when a variation is included in the AM-PM characteristic. FIG. 5A illustrates an example of the spectrum in the case of the delay amount $\tau=\tau 1$ ($<\tau 0$), FIG. 5B illustrates an example of the spectrum in the case of the delay amount $\tau=\tau 0$, and FIG. 5C illustrates an example of the spectrum in the case of the delay amount $\tau=\tau 2$ ($>\tau 0$). A broken line of FIG. 5 illustrates an example of the spectrum in the case of no variation in the AM-PM characteristic and in the case of the delay amount $\tau=\tau 0$.

As illustrated in FIG. 5A (delay amount $\tau 1$), phase compensation control section 151 acquires ACLR 1110 as the power level at a mistuned point of −5 MHz from the carrier frequency, and acquires ACLR 1120 as the power level at a mistuned point of +5 MHz from the carrier frequency.

As illustrated in FIG. 5C (delay amount $\tau 2$), phase compensation control section 151 acquires ACLR 1210 as the power level at the mistuned point of −5 MHz from the carrier frequency, and acquires ACLR 1220 as the power level at the mistuned point of +5 MHz from the carrier frequency. Phase compensation control section 151 uses the ACLR [dBc] as the power level, thereby easily recognizing an influence of the distortion.

Figure 6:
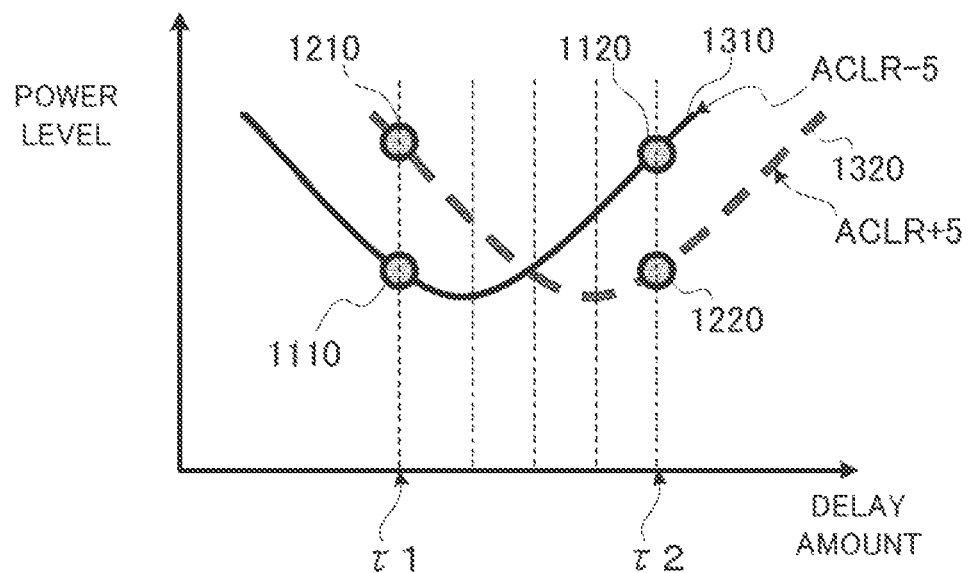
FIG. 6 is a view illustrating a relationship between the ACLR and a delay amount.

FIG. 6 illustrates a relationship between ACLRs 1110, 1120, 1210, 1220 and the delay amount. In FIG. 6, ACLR characteristic 1310 indicates a relationship between ACLRs 1110 and 1120 of the low-frequency band (ACLR −5) at the mistuned point of −5 MHz from the carrier frequency and the delay amount. In FIG. 6, ACLR characteristic 1320 indicates a relationship between ACLRs 1210 and 1220 of the high-frequency band (ACLR +5) at the mistuned point of +5 MHz from the carrier frequency and the delay amount.

Phase compensation control section 151 calculates the imbalanced amount at each delay amount from the ACLR characteristics of the low-frequency band and the high-frequency band. As used herein, the imbalanced amount means the relative level difference between the power level (in terms of dBm) of the low-frequency band and the power level (in terms of dBm) of the high-frequency band, and the low-frequency band and the high-frequency baud are separated from the carrier frequency fc by the same mistuned frequency.

For example, phase compensation control section 151 calculates a result, in which the power level in the high-frequency band (ACLR +5) is subtracted from the power level in the low-frequency band (ACLR −5), as the imbalanced amount at the delay amounts $\tau 1$ and $\tau 2$.

Figure 7:
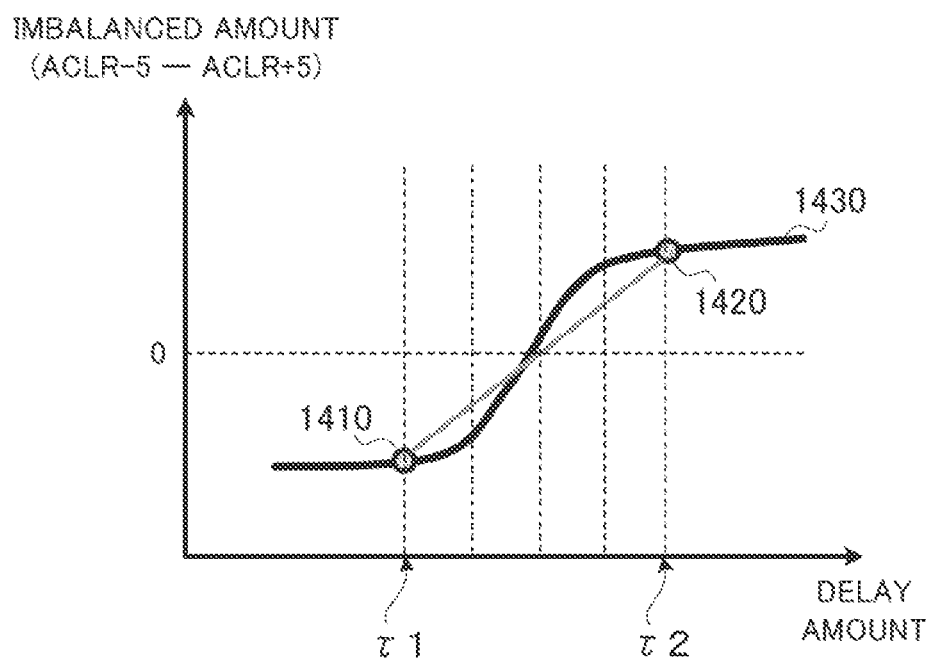
FIG. 7 is a view illustrating imbalanced amounts at delay amounts $\tau 1$ and $\tau 2$.

FIG. 7 illustrates imbalanced amounts 1410 and 1420 at the delay amounts $\tau 1$ and $\tau 2$. In FIG. 7, characteristic 1430 indicates an imbalance characteristic that is obtained when phase compensation control section 151 continuously adjusts the delay amount of delay adjuster 140.

Phase compensation control section 151 changes the delay amount of delay adjuster 140 into at least the first delay amount $\tau 1$ and the second delay amount $\tau 2$ to measure the at least two imbalanced amounts.

Using imbalanced amounts 1410 and 1420 corresponding to at least the two delay amounts $\tau 1$ and $\tau 2$, phase compensation control section 151 generates the compensation characteristic signal for specifying the compensation characteristic that compensates the AM-PM characteristic of high-frequency power amplifier 170. Specifically, phase compensation control section 151 determines [1] a shape of AM-PM in the compensation characteristic and [2] a change amount of the shape of the AM-PM in the compensation characteristic as pieces of information for specifying the compensation characteristic, and includes the pieces of information in the compensation characteristic signal.

A method for determining the shape of the AM-PM of the compensation characteristic and a method for determining the change amount of the shape of the AM-PM will be described below.

[1] Shape of AM-PM

Figure 8:
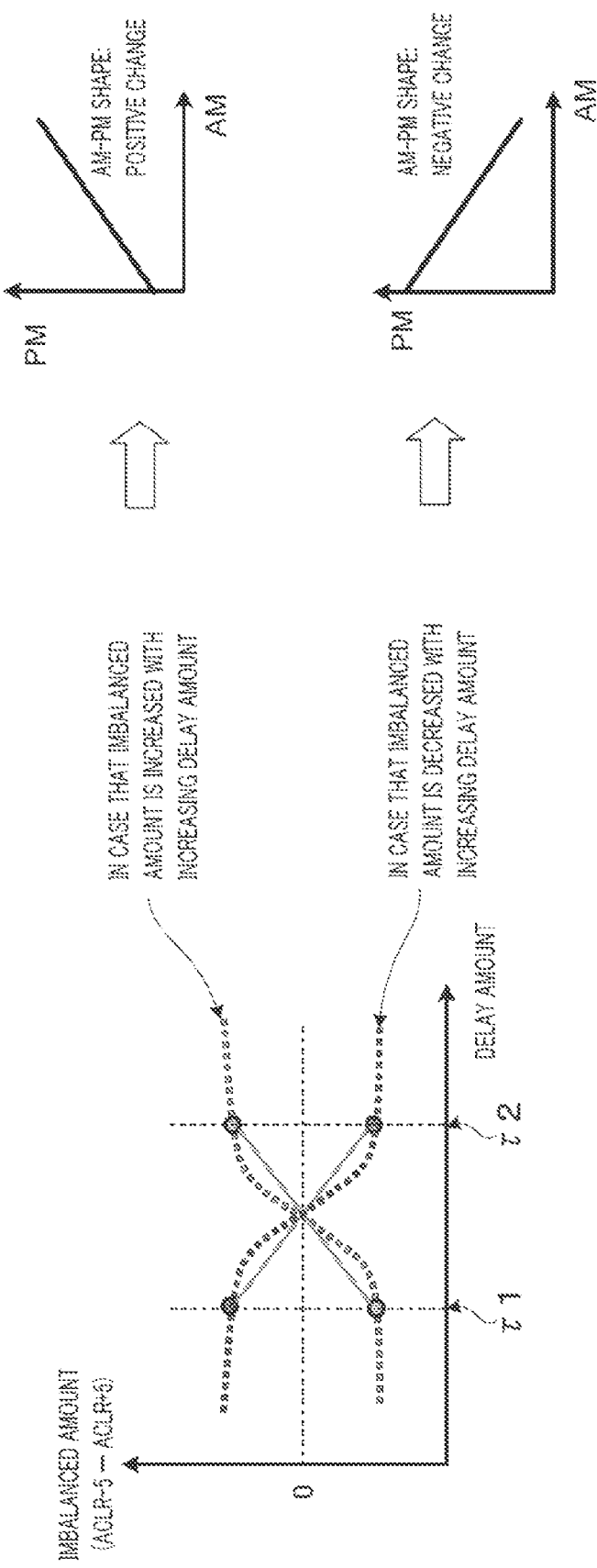
FIG. 8 is a view for explaining a method for determining a shape of the AM-PM characteristic of a compensation characteristic.

Phase compensation control section 151 determines the shape of the AM-PM of the compensation characteristic, which is used in variable phase compensation section 151, from the relationship between the delay amounts $\tau 1$ and $\tau 2$ and the imbalanced amounts at the delay amounts $\tau 1$ and $\tau 2$. The method for determining the shape of the AM-PM characteristic of the compensation characteristic will be described with reference to FIG. 8.

For example, in the case that the imbalanced amount indicates a positive value when the delay amount $\tau$ in delay adjuster 140 is larger than the reference delay amount $\tau 0$, phase compensation control section 151 determines that a positively-changing shape is used as the shape of the AM-PM of the compensation characteristic. As used herein, the positively-changing shape means a shape in which the PM is increased with increasing AM.

On the other hand, in the case that the imbalanced amount indicates a negative value when the delay amount $\tau$ in delay adjuster 140 is larger than the reference delay amount $\tau 0$, phase compensation control section 151 determines that a negatively-changing shape is used as the shape of the AM-PM of the compensation characteristic. The negatively-changing shape means a shape in which the PM is decreased with increasing AM.

[2] Change Amount of Shape of AM-PM

Figure 9:
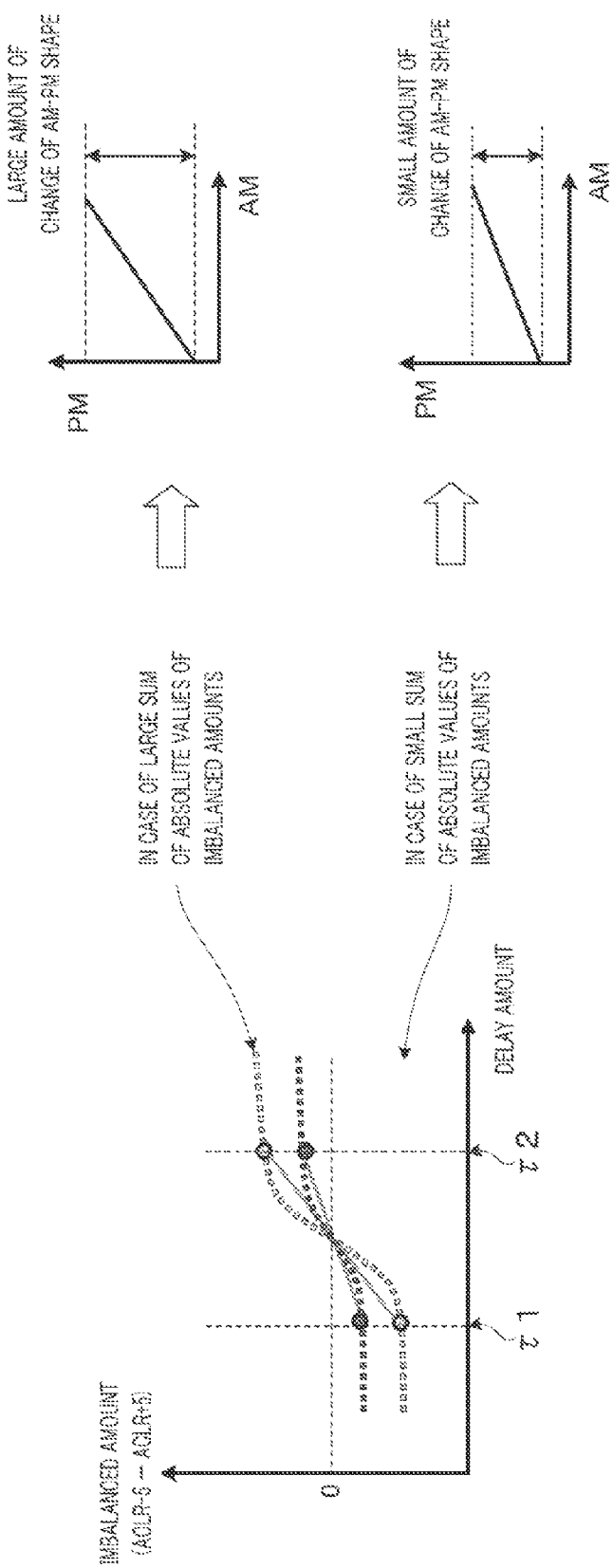
FIG. 9 is a view for explaining the method for determining a change amount of the shape of the AM-PM characteristic of the compensation characteristic.

Phase compensation control section 151 measures the imbalanced amounts at the delay amounts $\tau 1$ and $\tau 2$ in different times, and determines the change amount of the shape of the AM-PM of the compensation characteristic, which is used in variable phase compensation section 152, based on the sum of absolute values of the imbalanced amounts. The method for determining the change amount of the shape of the AM-PM characteristic of the compensation characteristic will be described with reference to FIG. 9.

With increasing sum of the imbalanced amounts, phase compensation control section 151 sets the change amount (a value in which the minimum PM value of the AM-PM shape is subtracted from the maximum PM value) of the shape of the AM-PM of the compensation characteristic, which is used in variable phase compensation section 152, to a larger value.

On the other hand, with decreasing sum of the imbalanced amounts, phase compensation control section 151 sets the change amount of the shape of the AM-PM of the compensation characteristic, which is used in variable phase compensation section 152, to a smaller value.

Therefore, using imbalanced amounts 1410 and 1420 corresponding to at least the two delay amounts $\tau 1$ and $\tau 2$, phase compensation control section 151 determines the pieces of information for specifying the compensation characteristic that compensates the AM-PM characteristic of high-frequency power amplifier 170. At this point, the pieces of information for specifying the compensation characteristic includes [1] the shape of the AM-PM in the compensation characteristic and [2] the change amount of the shape of the AM-PM in the compensation characteristic. Phase compensation control section 151 generates the pieces of information and outputs the pieces of information as the compensation characteristic signal to variable phase compensation section 152.

Next, an internal configuration and an operation of variable phase compensation section 152 will be described below.

[Configuration Example #1]

Figure 10:
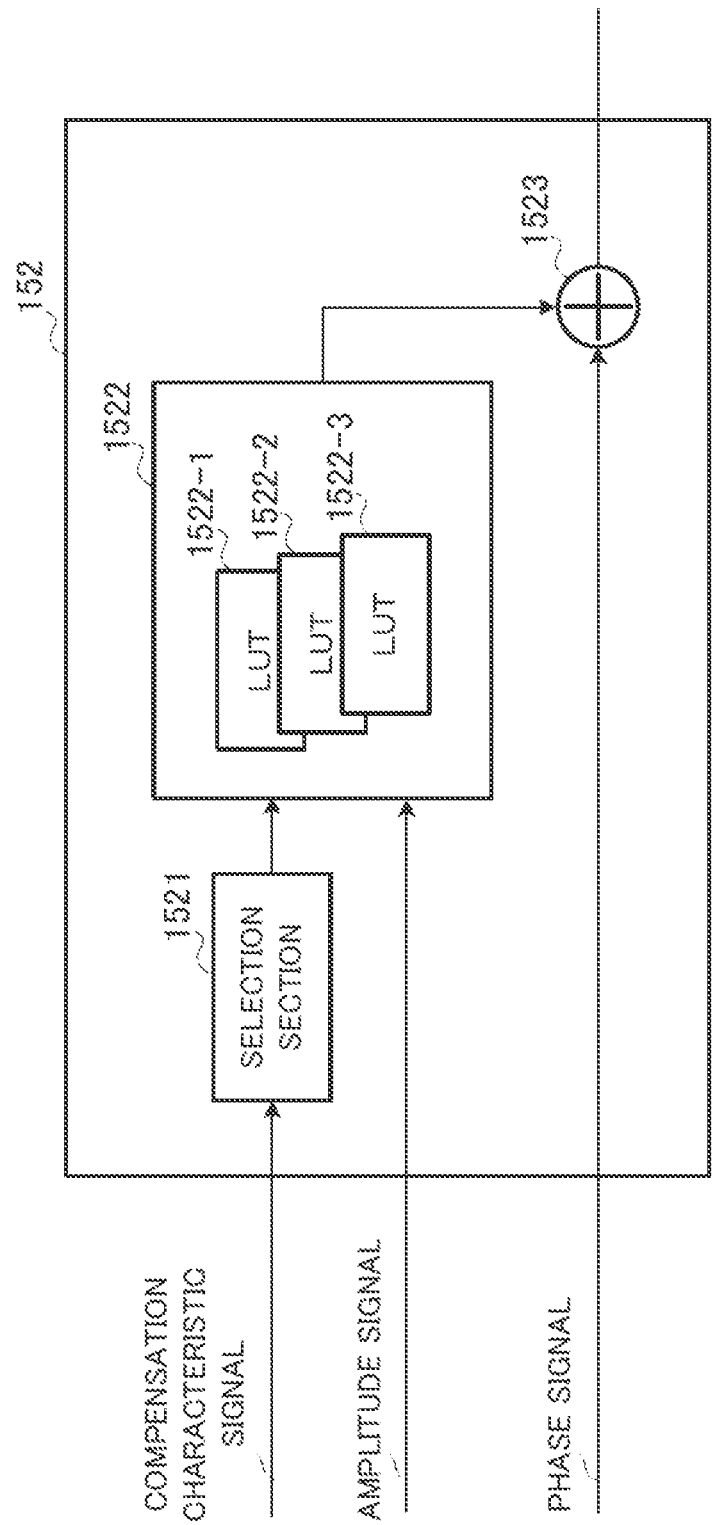
FIG. 10 is a view illustrating an example of an internal configuration of a variable phase compensation section according to Embodiment 1.

FIG. 10 illustrates an example of the internal configuration of variable phase compensation section 152. Variable phase compensation section 152 of FIG. 10 includes selection section 1521, LUT (Look Up Table) group 1522, and adder 1523.

Figure 11A:
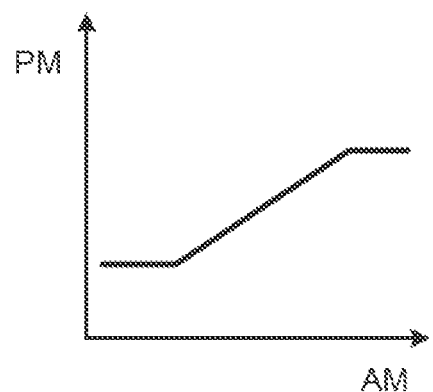
FIG. 11 is a view illustrating an example of the compensation characteristic indicated by an amplitude level and a compensation phase amount, which are retained by each of LUTs.
Figure 11B:
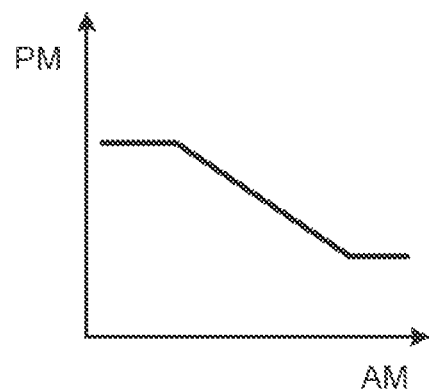
Figure 11C:
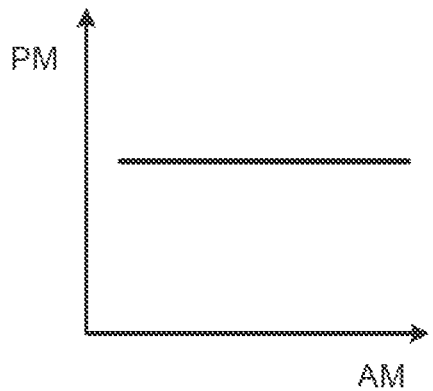

LUT group 1522 includes LUTs 1522-1 to 1522-3. LUTs 1522-1 to 1522-3 are tables that provide the compensation characteristic compensating the AM-PM characteristic of high-frequency power amplifier 170, and provide different compensation characteristics, respectively. LUTs 1522-1 to 1522-3 retain amplitude levels and compensation phase amounts while correlating the amplitude levels and the compensation phase amounts, respectively. FIG. 11 illustrates an example of the compensation characteristic indicated by the amplitude level and the compensation phase amount, which are retained by each of LUTs 1522-1 to 1522-3.

Although FIG. 10 illustrates the example in which LUT group 1522 retains the three LUTs, the number of retained LUTs is not limited to three.

Selection section 1521 selects the LUT indicating the compensation characteristic that compensates the AM-PM characteristic of high-frequency power amplifier 170 from LUTs 1522-1 to 1522-3 based on the compensation characteristic signal output from phase compensation control section 151. Variable phase compensation section 152 outputs the phase compensation amount φr corresponding to the amplitude signal from the LUT, which is selected from LUTs 1522-1 to 1522-3 by selection section 1521, to adder 1523.

Adder 1523 performs the phase modulation by adding the phase compensation amount φr corresponding to the amplitude signal to the phase signal φ(t), and outputs the phase signal φ'(t) (=φ(t)+φr) of the post-phase compensation to phase modulation section 160.

By this means, the plural LUTs that provide the compensation characteristic compensating the AM-PM characteristic of high-frequency power amplifier 170 are previously prepared in LUT group 1522. As a result, the distortion can individually be compensated even if the AM-PM characteristic is individually changed by the individual variation to individually change the compensation characteristic.

Instead of the plural LUTs, variable phase compensation section 152 prepares plural calculating equations that calculate the phase compensation amount, and selection section 1521 may switch the calculating equations according to the compensation characteristic signal.

[Configuration Example #2]

Figure 12:
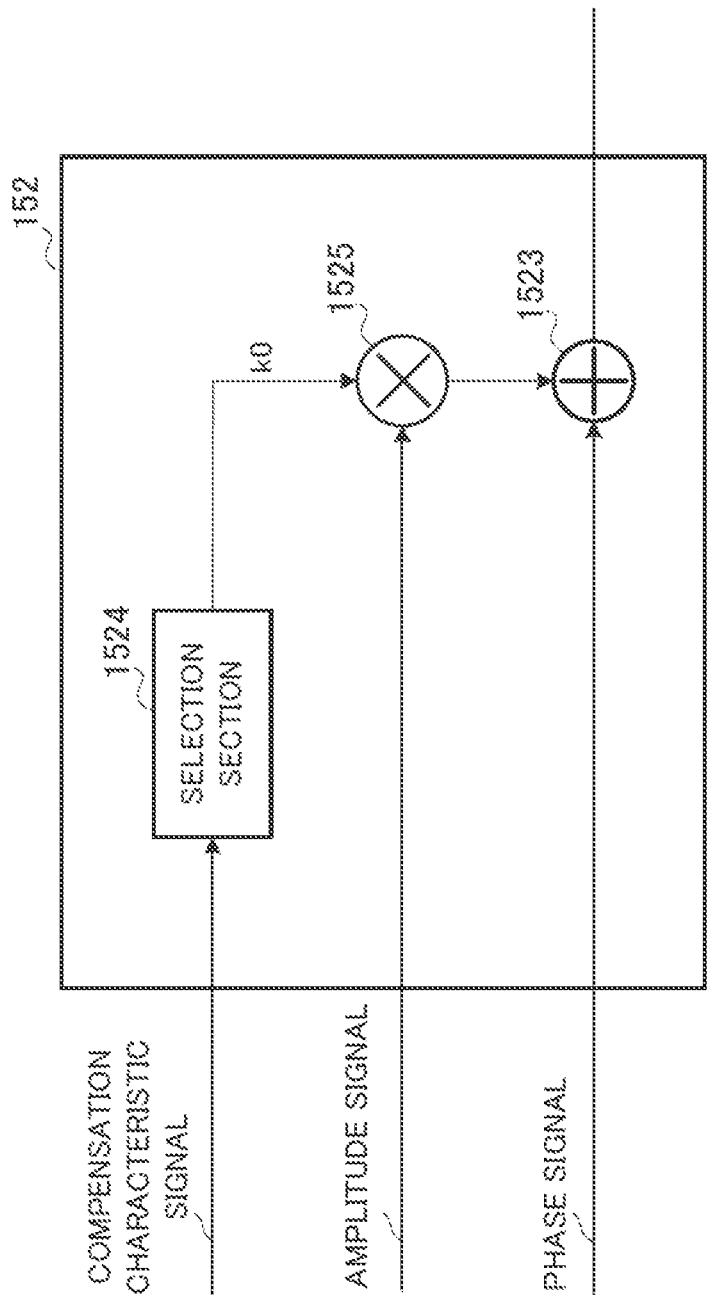
FIG. 12 is a view illustrating another example of the internal configuration of the variable phase compensation section according to Embodiment 1.

FIG. 12 illustrates another example of the internal configuration of variable phase compensation section 152. Variable phase compensation section 152 of FIG. 12 includes selection section 1524, multiplier 1525, and adder 1523.

Selection section 1524 sets a correction factor k0, which is multiplied by the amplitude signal in multiplier 1525, based on the compensation characteristic signal output from phase compensation control section 151. As described above, phase compensation control section 151 outputs [1] the information on the shape of the AM-PM in the compensation characteristic and [2] the information on the change amount of the shape of the AM-PM in the compensation characteristic as the compensation characteristic signal to variable phase compensation section 152. Selection section 1524 sets the correction factor k0, which compensates the AM-PM characteristic of high-frequency power amplifier 170, based on the pieces of information. In this case, variable phase compensation section 152 needs not to include LUT group 1522 unlike [Configuration Example #1], so that it is possible to reduce a circuit scale.

Multiplier 1525 multiplies the amplitude signal r(t) and the correction factor k0 to generate the phase compensation amount φr (=k0·r(t)), and outputs the generated phase compensation amount φr to adder 1523.

[Configuration Example #3]

Figure 13:
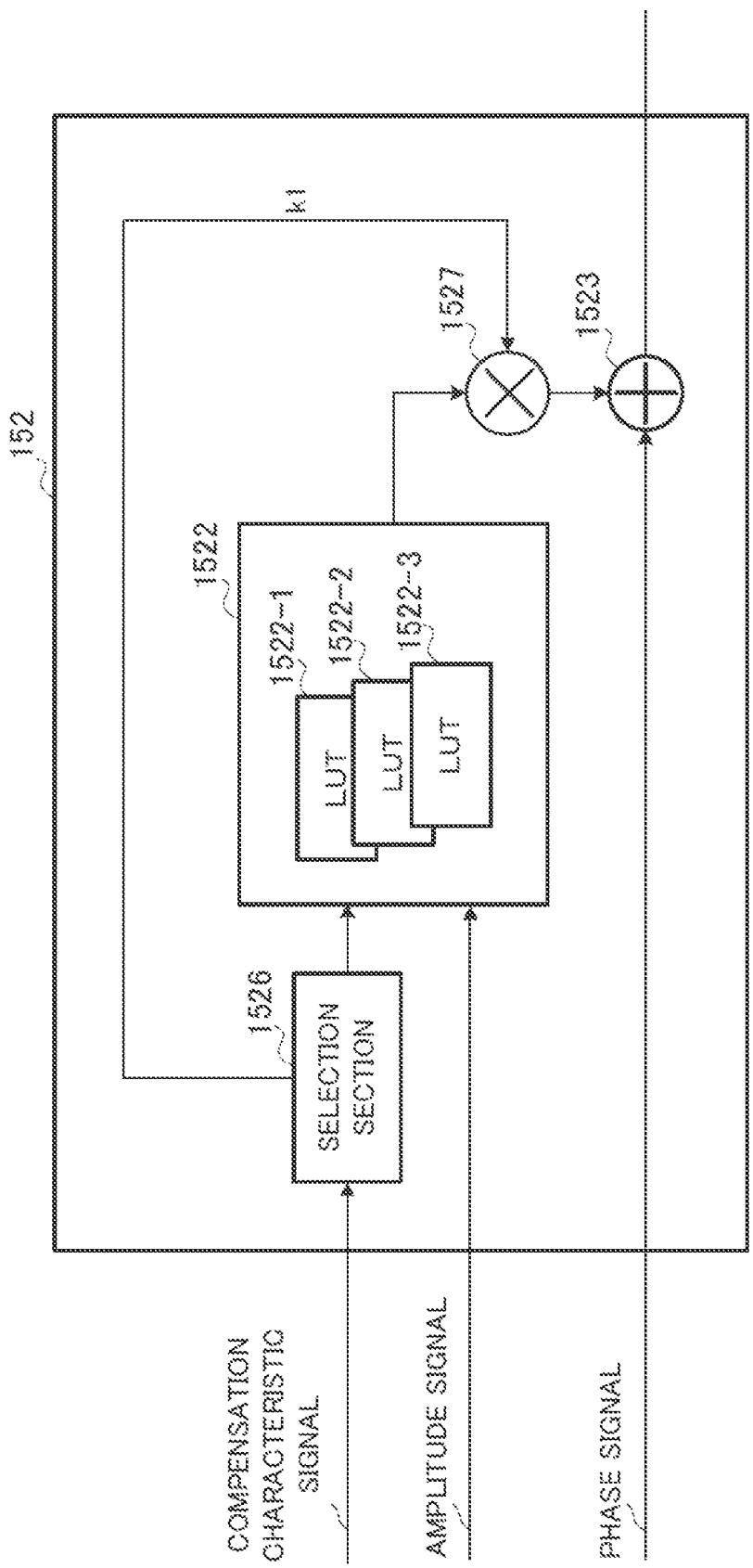
FIG. 13 is a view illustrating still another example of the internal configuration of the variable phase compensation section according to Embodiment 1.

FIG. 13 illustrates still another example of the internal configuration of variable phase compensation section 152. Variable phase compensation section 152 shown in FIG. 13 includes selection section 1526, LUT (Look Up Table) group 1522, multiplier 1527, and adder 1523.

Selection section 1526 selects the LUT closest to the compensation characteristic that compensates the AM-PM characteristic of high-frequency power amplifier 170 from LUTs 1522-1 to 1522-3 based on the compensation characteristic signal output from phase compensation control section 151. Variable phase compensation section 152 outputs the phase compensation amount φr corresponding to the amplitude signal from the LUT, which is selected from LUTs 1522-1 to 1522-3, to multiplier 1527.

Furthermore, selection section 1526 sets a correction factor k1, which corrects an error with the compensation characteristic indicated by the selected LUT, based on the compensation characteristic signal output from phase compensation control section 151.

Multiplier 1527 multiplies the phase compensation amount φr and the correction factor k1 to generate the phase compensation amount φ'r (=k1·φr), and outputs the generated phase compensation amount φ'r to adder 1523.

By this means, the compensation characteristic provided by the previously-retained LUTs 1522-1 to 1522-3 can finely be adjusted so as to be matched with the actual compensation characteristic. Therefore, even if LUT group 1522 prepares only the typical LUT that provides the compensation characteristic compensating the AM-PM characteristic of high-frequency power amplifier 170, it is possible to individually perform the distortion compensation to the difference in compensation characteristic, which is caused by the individual variation of high-frequency power amplifier 170.

As described above, in the present embodiment, frequency converter 180 converts the frequency of the output signal of high-frequency power amplifier 170 and outputs the signal in the frequency domain. Phase compensation section 150 controls the delay amount of delay adjuster 140, and determines the compensation characteristic that compensates the amplitude-phase characteristic of high-frequency power amplifier 170 using the signals in the frequency domains at the different delay amounts. More specifically, in each delay amount, phase compensation section 150 acquires the power levels of the low-frequency band and the high-frequency band, in which the mistuned frequencies are identical, from the signals in the frequency domains at the different delay amounts. Phase compensation section 150 calculates the imbalanced amount (relative level difference) between the power levels of the low-frequency band and the high-frequency band in each delay amount, and determines the compensation characteristic based on the relationship between the imbalanced amount (relative level difference) and the delay amount. Phase compensation section 150 compensates the phase signal by adding the phase compensation amount corresponding to the amplitude signal in the determined compensation characteristic to the phase signal.

By this means, even if the relationship (AM-PM characteristic) between power supply voltage Vcc and passage phase Ph is changed by the individual variation of high-frequency power amplifier 170 and the variation in voltage, it is possible to compensate the AM-PM characteristic of high-frequency power amplifier 170 without providing a demodulator that leads to the increase of the circuit scale. As a result, it is possible to effectively compensate the distortion component caused by the individual variation of high-frequency power amplifier 170 by a small man-hour, and suppress the degradation of the signal quality.

(Embodiment 2)

In the present embodiment, a polar modulation transmission circuit that sets the delay amount of delay adjuster 140 to an optimum value based on [1] the shape of the AM-PM in the compensation characteristic and [2] the change amount of the shape of the AM-PM in the compensation characteristic will be described.

Figure 14:
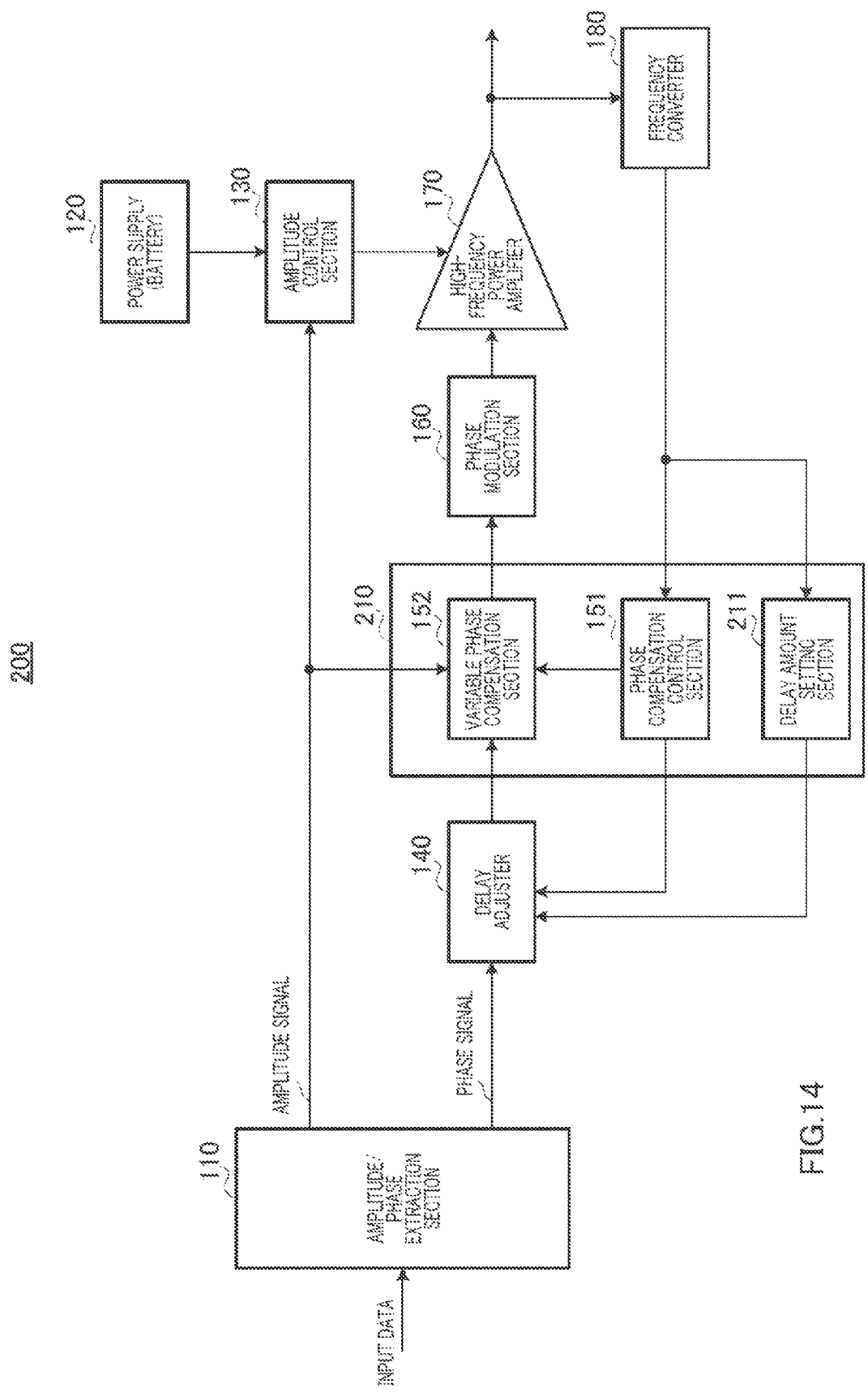
FIG. 14 is a view illustrating a configuration of a main part of a polar modulation transmission circuit according to Embodiment 2 of the present invention.

FIG. 14 illustrates a configuration of a main part of a polar modulation transmission circuit (hereinafter simply referred to as a "transmission circuit") according to the present embodiment of the present invention. In the transmission circuit of the present embodiment of FIG. 14, the component common to that of FIG. 4 is designated by the same numeral, and the description is omitted. Transmission circuit 200 of FIG. 14 differs from transmission circuit 100 of FIG. 4 in that transmission circuit 200 includes phase compensation section 210 instead of phase compensation section 150.

Phase compensation section 210 includes phase compensation control section 151, variable phase compensation section 152, and delay amount setting section 211.

Delay amount setting section 211 sets an optimum value as the delay amount of delay adjuster 140 using the signal (spectrum) in the frequency domain of the output signal of high-frequency power amplifier 170, which is input from frequency converter 180. Delay amount setting section 211 generates the delay adjusting signal indicating the set optimum delay amount, and outputs the generated delay adjusting signal to delay adjuster 140.

A method for setting the delay amount in delay amount setting section 211 will be described with reference to FIG. 15.

Figure 15:
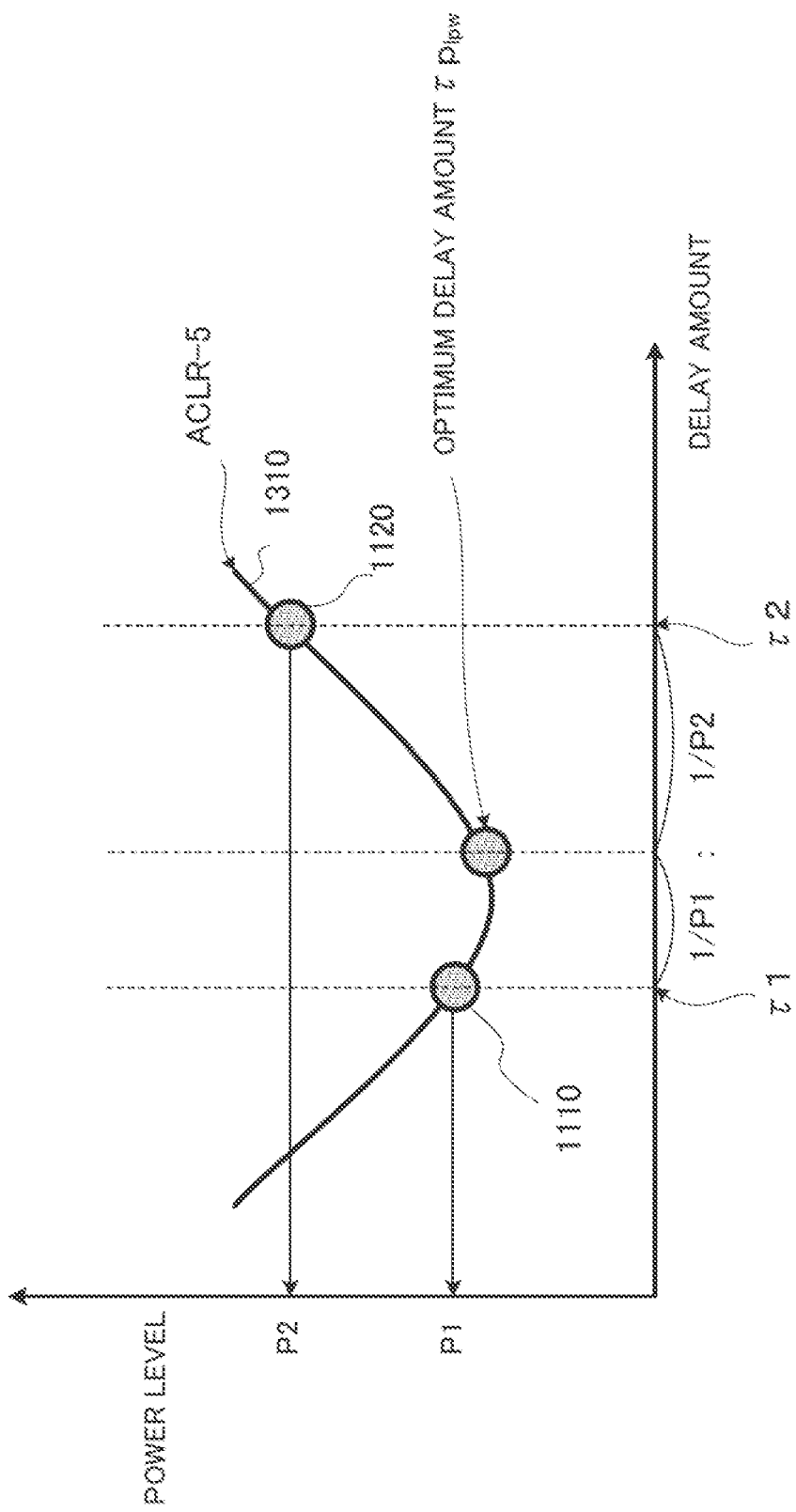
FIG. 15 is a view for explaining a method for setting a delay amount in a delay amount setting section.

FIG. 15 illustrates ACLR characteristic 1310 illustrated in FIG. 6. ACLR characteristic 1310 indicates the relationship between the ACLR of the low-frequency band (ACLR −5) at the mistuned point of −5 MHz from the carrier frequency and the delay amount. In ACLR characteristic 1310, ACLR 1110 indicates the ACLR at the delay amount τ1 and ACLR 1120 indicates the ACLR at the delay amount τ2. As illustrated in FIG. 15, it is assumed that P1 is the power level of ACLR 1110 while P2 is the power level of ACLR 1120.

At this point, delay amount setting section 211 calculates a delay amount τP$_{low}$ in the low-frequency band (ACLR −5) between the first delay amount τ1 and the second delay amount τ2 based on a reciprocal of a proportion of the power level P1 with respect to the first delay amount τ1 to the power level P2 with respect to the second delay amount τ2.

Specifically, delay amount setting section 211 sets the delay amount τP$_{low}$ using an equation 1.

$$\tau P_{low} = C(\tau 2 - \tau 1)/P1 + \tau 1 \quad \text{(Equation 1)}$$

where C=P1·P2/(P1+P2)

Thus, as illustrated in FIG. 15, the power level indicates a value close to the minimum value in the low-frequency band (ACLR −5) at the delay amount τP$_{low}$ by calculating the delay amount τP$_{low}$.

Similarly, delay amount setting section 211 calculates a delay amount τP$_{high}$ in the high-frequency band (ACLR +5) from the relationship between the ACLR of the high-frequency band (ACLR +5) at the mistuned point of +5 MHz from the carrier frequency and the delay amount. Specifically, delay amount setting section 211 calculates a delay amount τP$_{high}$ in the high-frequency band (ACLR +5) between the first delay amount τ1 and the second delay amount τ2 using equation 2 based on the reciprocal of the proportion of the power level P1 with respect to the first delay amount τ1 to the power level P2 with respect to the second delay amount τ2.

$$\tau P_{high} = C(\tau 2 - \tau 1)/P1 + \tau 1 \quad \text{(Equation 2)}$$

Delay amount setting section 211 sets a median value between the delay amount τP$_{low}$ and the delay amount τP$_{high}$ as the optimum delay amount τP in delay adjuster 140.

Delay amount setting section 211 outputs the delay adjusting signal corresponding to the set delay amount Tp to delay adjuster 140. By this means, the delay amount of delay adjuster 140 is set to the optimum delay amount.

As described above, in the present embodiment, delay amount setting section 211 of phase compensation section 210 sets the optimum value as the delay amount of delay adjuster 140 based on the power level P1 of the first delay amount τ1 in the low-frequency band and the power level P2 of the second delay amount τ2 in the high-frequency baud.

By this means, it is possible to correct the path difference (relative delay difference) between the AM path and the PM path. As a result, even if the path difference (relative delay difference) between the AM path and the PM path is changed, it is possible to effectively compensate the path difference (relative delay difference) between the AM path and the PM path with the small man-hour, and suppress the degradation of the ACLR characteristic, which is caused by the relative delay difference.

(Embodiment 3)

Generally, when an ambient temperature is changed, a characteristic of the high-frequency power amplifier varies in consideration of an operating environment of the transmission circuit. For example, in the high-frequency power amplifier including an HBT (Heterojunction Bipolar Transistor), a relationship (AM-PM characteristic) between the power supply voltage supplied to the power supply voltage of the high-frequency power amplifier and the passage phase varies by the change of the temperature. That is, the passage phase varies by the temperature even if the same power supply voltage is supplied to the high-frequency power amplifier. Because the AM-PM characteristic of the high-frequency power amplifier is degraded by the variation in passage phase, for example, unfortunately a disturbing signal is generated to the adjacent frequency band to degrade the ACLR. Therefore, it is necessary to adaptively perform the temperature compensation according to the temperature change. In the present embodiment, a polar modulation transmission circuit that adaptively performs the temperature compensation according to the temperature change will be described.

Figure 16:
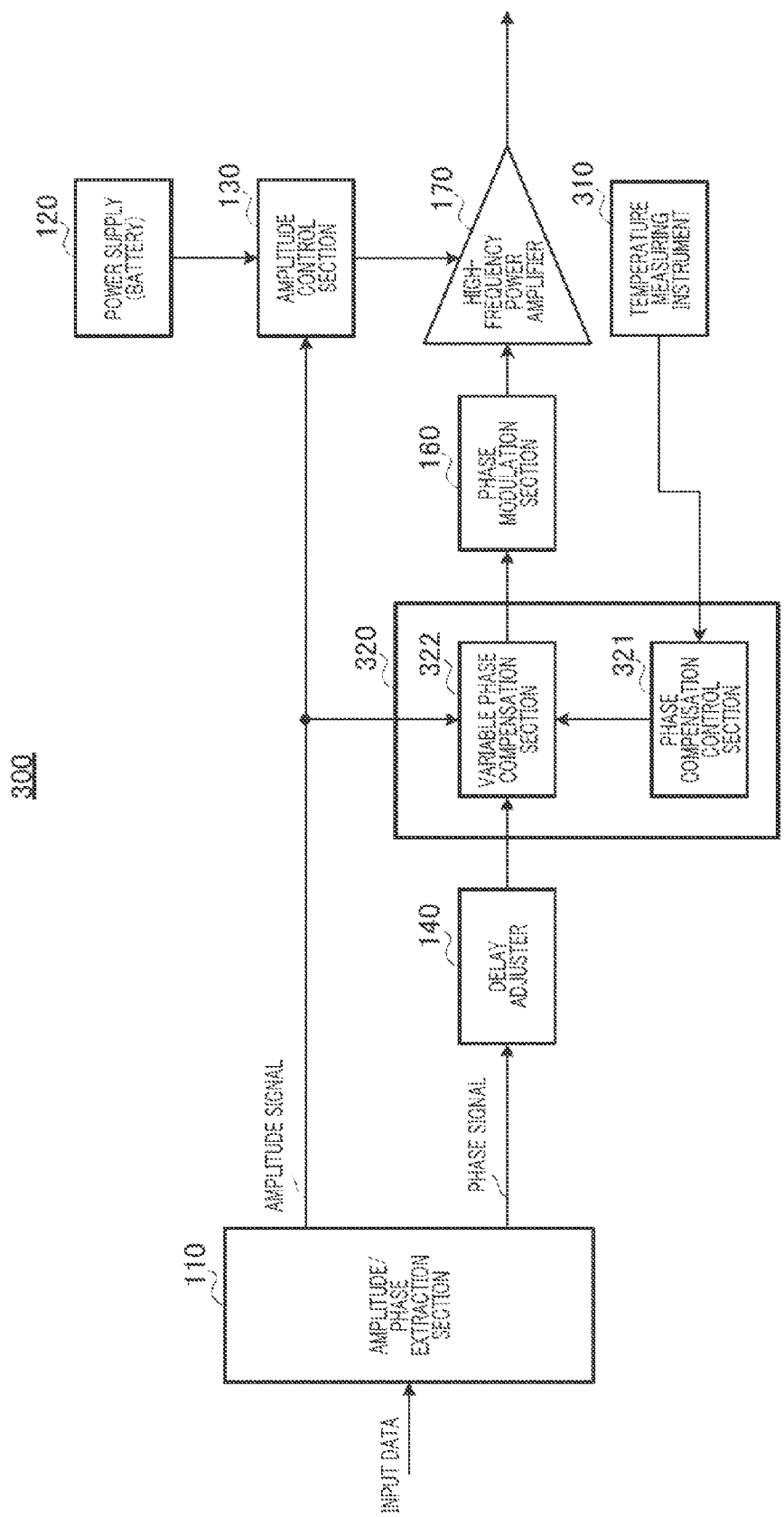
FIG. 16 is a view illustrating a configuration of a main part of a polar modulation transmission circuit according to Embodiment 3 of the present invention.

FIG. 16 illustrates a configuration of a main part of a polar modulation transmission circuit (hereinafter simply referred to as a "transmission circuit") according to the present embodiment of the present invention. In the transmission circuit of the present embodiment of FIG. 16, the component common to that of FIG. 4 is designated by the same numeral, and the description is omitted. Transmission circuit 300 of FIG. 16 differs from transmission circuit 100 of FIG. 4 in that transmission circuit 300 includes phase compensation section 320 instead of phase compensation section 150 and that temperature measuring instrument 310 is added.

Temperature measuring instrument 310 measures a temperature around high-frequency power amplifier 170, and outputs the measurement result to phase compensation section 320.

Phase compensation section 320 includes phase compensation control section 321 and variable phase compensation section 322.

Phase compensation control section 321 outputs the measurement result of the temperature around high-frequency power amplifier 170, which is input from temperature measuring instrument 310, as the compensation characteristic signal to variable phase compensation section 322.

Based on the temperature measurement result indicated by the compensation characteristic signal from phase compensation control section 321, variable phase compensation section 322 determines the compensation characteristic that compensates the AM-PM characteristic of high-frequency power amplifier 170. The internal configuration of variable phase compensation section 322 is identical to that of variable phase compensation section 152 in [Configuration Example #1] to [Configuration Example #3] illustrated in FIGS. 10, 12, and 13. Therefore, the configuration diagram of variable phase compensation section 322 is omitted, and only the operation of variable phase compensation section 322 will be described below.

[Configuration Example #1]

LUT group 1522 includes LUTs 1522-1 to 1522-3. LUTs 1522-1 to 1522-3 are tables that provide the compensation characteristic compensating the AM-PM characteristic of high-frequency power amplifier 170, and correspond to different temperature, respectively.

Selection section 1521 selects the LUT indicating the compensation characteristic that compensates the AM-PM characteristic of high-frequency power amplifier 170 from LUTs 1522-1 to 1522-3 based on the temperature measurement result indicated by the compensation characteristic signal from phase compensation control section 321.

[Configuration Example #2]

Selection section 1524 sets the correction factor k0, which is multiplied by the amplitude signal in multiplier 1525, based on the temperature measurement result indicated by the compensation characteristic signal output from phase compensation control section 321. As described above, because phase compensation control section 321 outputs the measurement result of the temperature around high-frequency power amplifier 170 as the compensation characteristic signal to variable phase compensation section 322, selection section 1524 sets the correction factor k0 corresponding to the temperature measurement result. In this case, variable phase compensation section 152 needs not to include LUT group 1522 unlike [Configuration Example #1], so that it is possible to reduce a circuit scale.

[Configuration Example #3]

Selection section 1526 selects the LUT closest to the compensation characteristic that compensates the AM-PM characteristic of high-frequency power amplifier 170 from LUTs 1522-1 to 1522-3 based on the temperature measurement result indicated by the compensation characteristic signal output from phase compensation control section 321.

Variable phase compensation section 322 outputs the phase compensation amount φr corresponding to the amplitude signal from the LUT, which is selected from LUTs 1522-1 to 1522-3, to multiplier 1527.

Furthermore, selection section 1526 sets a correction factor k1, which corrects the error with the compensation characteristic indicated by the selected LUT, based on the temperature measurement result indicated by the compensation characteristic signal output from phase compensation control section 321.

By this means, it is possible to finely adjust the compensation characteristic provided by the previously-retained LUTs 1522-1 to 1522-3 so as to be matched with the actual compensation characteristic. As a result, even if LUT group 1522 prepares only the typical LUT that provides the compensation characteristic compensating the AM-PM characteristic of high-frequency power amplifier 170, it is possible to individually perform the distortion compensation to the difference in compensation characteristic, which is caused by the individual variation of high-frequency power amplifier 170.

As described above, in the present embodiment, temperature measuring instrument 310 measures the temperature around high-frequency power amplifier 170, and phase compensation section 320 corrects the phase compensation amount based on the temperature measurement result.

Therefore, even if the relationship (AM-PM characteristic) between power supply voltage Vcc and passage phase Ph is changed by the temperature change of high-frequency power amplifier 170, it is possible to compensate the AM-PM characteristic of high-frequency power amplifier 170 without providing the demodulator that leads to the increase of the circuit scale. As a result, it is possible to effectively compensate the distortion component caused by the temperature change high-frequency power amplifier 170 by the small man-hour, and suppress the degradation of the signal quality.

(Embodiment 4)

In the present embodiment, a polar modulation transmission circuit that controls the phase compensation amount according to the signal in the frequency domain obtained by performing the frequency conversion of the output signal of high-frequency power amplifier and the temperature around high-frequency power amplifier 170 will be described.

Figure 17:
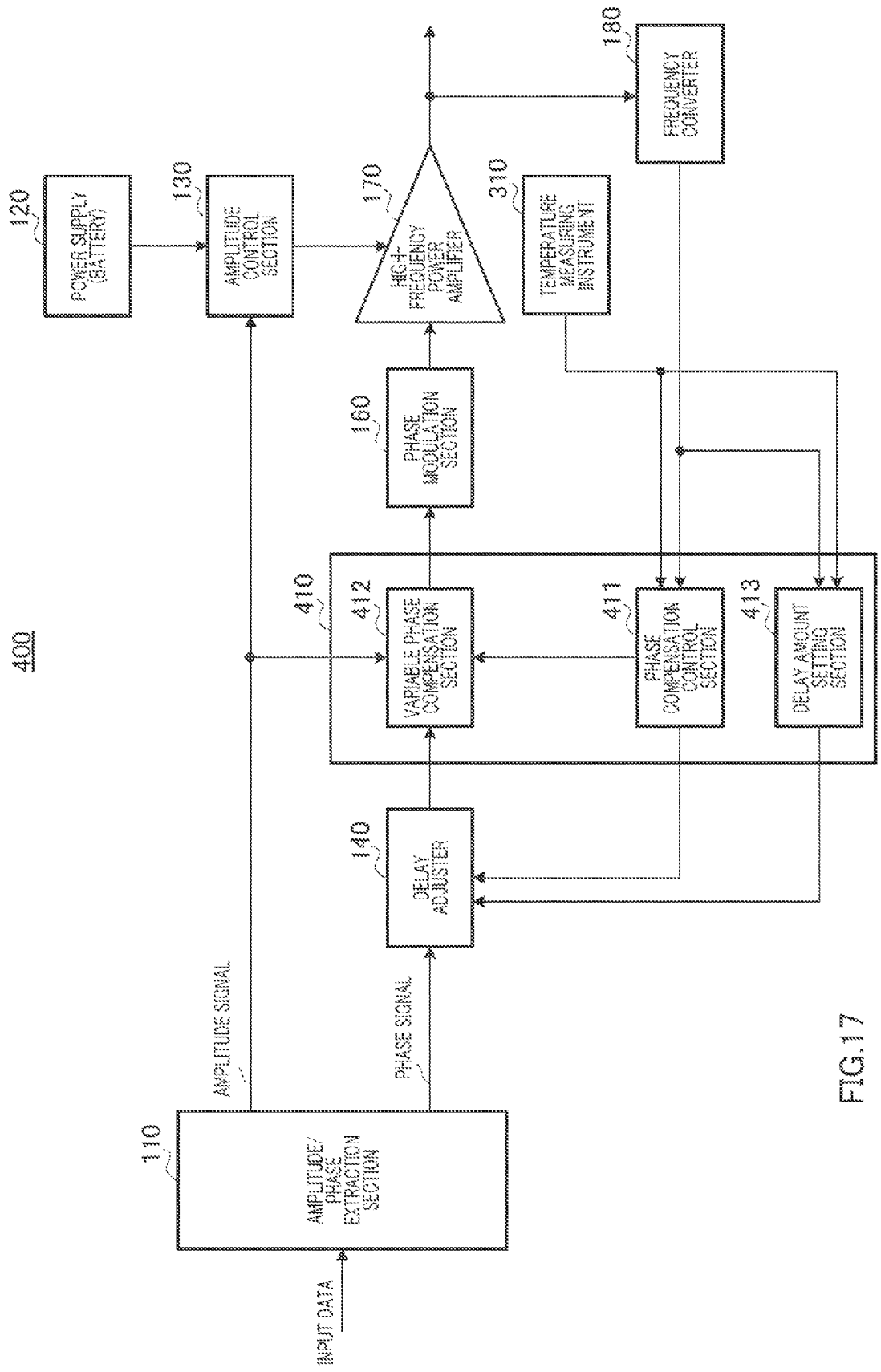
FIG. 17 is a view illustrating a configuration of a main part of a polar modulation transmission circuit according to Embodiment 4 of the present invention.

FIG. 17 illustrates a configuration of a main part of a polar modulation transmission circuit (hereinafter simply referred to as a "transmission circuit") according to the present embodiment of the present invention. In the transmission circuit of Embodiment 4 of FIG. 17, the component common to that of FIGS. 14 and 16 is designated by the same numeral of FIG. 14, and the description is omitted. Transmission circuit 400 of FIG. 17 differs from transmission circuit 200 of FIG. 14 in that transmission circuit 400 includes phase compensation section 410 instead of phase compensation section 210 and that temperature measuring instrument 310 is further added.

Phase compensation section 410 includes phase compensation control section 411, variable phase compensation section 412, and delay amount setting section 413.

Similarly to phase compensation control section 151, using the signals in the frequency domains at the different delay amounts, phase compensation control section 411 controls the delay amount in delay adjuster 140 to generate information in specifying the compensation characteristic that compensates the amplitude-phase characteristic of high-frequency power amplifier 170.

Similarly to phase compensation control section 321, phase compensation control section 411 includes the measurement result of the temperature around high-frequency power amplifier 170, which is input from temperature measuring instrument 310, and the information specifying the compensation characteristic that compensates the amplitude-phase characteristic of high-frequency power amplifier 170 in the compensation characteristic signal. Phase compensation control section 411 outputs the compensation characteristic signal to variable phase compensation section 412.

Based on the compensation characteristic signal from phase compensation control section 411, variable phase compensation section 412 determines the compensation characteristic that compensates the AM-PM characteristic of high-frequency power amplifier 170. The internal configuration of variable phase compensation section 412 is identical to that of variable phase compensation section 152 in [Configuration Example #1] to [Configuration Example #3] illustrated in FIGS. 10, 12, and 13. Therefore, the configuration diagram of variable phase compensation section 412 is omitted, and only the operation of variable phase compensation section 412 will be described below.

[Configuration Example #1]

LUT group 1522 includes LUTs 1522-1 to 1522-3. LUTs 1522-1 to 1522-3 are tables that provide the compensation characteristic compensating the AM-PM characteristic of high-frequency power amplifier 170 in each different temperature, provide different compensation characteristics, respectively, and correspond to different temperatures.

Selection section 1521 selects the LUT indicating the compensation characteristic that compensates the AM-PM characteristic of high-frequency power amplifier 170 from LUTs 1522-1 to 1522-3 based on the compensation characteristic signal output from phase compensation control section 411.

[Configuration Example #2]

Selection section 1524 sets the correction factor k0, which is multiplied by the amplitude signal in multiplier 1525, based on the compensation characteristic signal output from phase compensation control section 411. As described above, phase compensation control section 411 outputs [1] the information on the shape of the AM-PM in the compensation characteristic, [2] the information on the change amount of the shape of the AM-PM in the compensation characteristic, and the measurement result of the temperature around high-frequency power amplifier 170 as the compensation characteristic signal to variable phase compensation section 412. Assuming that the compensation characteristic has linearity, selection section 1524 can form the compensation characteristic using the pieces of information. Thus, selection section 1524 forms the compensation characteristic, and sets the correction factor k0 corresponding to the change amount in the formed compensation characteristic. In this case, variable phase compensation section 412 needs not to include LUT group 1522 unlike [Configuration Example #1], so that it is possible to reduce the circuit scale.

[Configuration Example #3]

Selection section 1526 selects the LUT closest to the compensation characteristic that compensates the AM-PM characteristic of high-frequency power amplifier 170 from LUTs 1522-1 to 1522-3 based on the compensation characteristic signal output from phase compensation control section 411.

Variable phase compensation section 412 outputs the phase compensation amount φr corresponding to the amplitude signal from the LUT, which is selected from LUTs 1522-1 to 1522-3, to multiplier 1527.

Further, selection section 1526 sets the correction factor k1, which corrects the error with the compensation characteristic indicated by the selected LUT, based on the compensation characteristic signal output from phase compensation control section 411.

Therefore, it is possible to finely adjust the compensation characteristic provided by the previously-retained LUTs 1522-1 to 1522-3 so as to be matched with the actual compensation characteristic. As a result, even if LUT group 1522 prepares only the typical LUT that provides the compensation characteristic compensating the AM-PM characteristic of high-frequency power amplifier 170, it is possible to individually perform the distortion compensation to the difference in compensation characteristic, which is caused by the individual variation of high-frequency power amplifier 170.

Similarly to delay amount setting section 211, delay amount setting section 413 sets the delay amount τp as the delay amount of delay adjuster 140 using the signal (spectrum) in the frequency domain of the output signal of high-frequency power amplifier 170, which is input from frequency converter 180. Delay amount setting section 413 also corrects the delay amount τp based on the measurement result of the temperature around high-frequency power amplifier 170, which is input from temperature measuring instrument 310. By this means, the influence of the path difference between the AM path and the PM path, which varies by the temperature change of high-frequency power amplifier 170, can be suppressed. Delay amount setting section 413 generates the delay adjusting signal indicating the delay amount τ'p of the post-correction, and outputs the generated delay adjusting signal to delay adjuster 140.

As described above, in the present embodiment, phase compensation section 410 sets the phase compensation amount corresponding to the amplitude signal and the delay amount based on the relationship between the imbalanced amount (relative level difference) and the delay amount and the measurement result of the temperature around high-frequency power amplifier 170. By this means, it is possible to compensate the distortion with higher accuracy compared with Embodiment 2.

The preferred embodiments of the present invention are described above by way of example. However, the present invention is not limited to the embodiments. It is possible to make various changes without departing from the scope of the present invention.

The disclosure of Japanese Patent Application No. 2009-161149, filed on Jul. 7, 2009, including the specification, drawings and abstract, is incorporated herein by reference in its entirety.

Industrial Applicability

In the polar modulation transmission circuit and the polar modulation transmission method of the present invention, it is possible to compensate the distortion component caused by the individual variation of the amplifier with the small man-hour to effectively suppress the degradation of the signal quality. For example, the polar modulation transmission circuit and the polar modulation transmission method are suitable to communication devices such as a mobile phone and a wireless LAN.

REFERENCE SIGNS LIST 100, 200, 300, 400 transmission circuit
110 amplitude/phase extraction section
120 power supply (battery)
130 amplitude control section
140 delay adjuster
150, 210, 320, 410 phase compensation section
151, 321, 411 phase compensation control section
152, 322, 412 variable phase compensation section
160 phase modulation section
170 high-frequency power amplifier
180 frequency converter
1521, 1524, 1526 selection section
1522 LUT group
1522-1 to 1522-3 LUT
1523 adder
1525, 1527 multiplier
211, 413 delay amount setting section
310 temperature measuring instrument

The invention claimed is:

1. A polar modulation transmission circuit comprising:
an extraction section that extracts an amplitude signal and a phase signal from a modulated signal to output the amplitude signal and the phase signal;
an amplitude control section that outputs a voltage corresponding to the amplitude signal;
a phase compensation section that performs phase compensation by operating on the phase signal with a phase compensation amount corresponding to the amplitude signal;

a phase modulation section that performs phase modulation of a high-frequency signal using the phase signal to which the phase compensation is performed, and generates a phase modulation signal;

an amplifying section that sets the voltage output from the amplitude control section as a power supply voltage, amplifies the phase modulation signal output from the phase modulation section, and outputs the amplified phase modulation signal; and conversion section that performs a fast Fourier transform of the output signal of the amplifying section to output a frequency spectrum signal to the phase compensation section, wherein the phase compensation section acquires power levels of a low-frequency band and a high-frequency band, which have an identical mistuned frequency, in each delay amount from a value of the frequency spectrum signal in different delay amounts, calculates a relative level difference between the power levels of the low-frequency band and the high-frequency band in each delay amount determines a compensation characteristic in order to compensate an amplitude-phase characteristic of the amplifying section based on a relationship between the relative level difference and the delay amount, and determines the phase compensation amount corresponding to the amplitude signal in the determined compensation characteristic.

2. The polar modulation transmission circuit according to claim 1, wherein the phase compensation section determines that the compensation characteristic is a characteristic in which the phase compensation amount is increased with increasing amplitude, when the relative level difference is increased with increasing delay amount.

3. The polar modulation transmission circuit according to claim 1, wherein the phase compensation section determines that the compensation characteristic is a characteristic in which a change of the phase compensation amount is increased with respect to a change of the amplitude signal, as a sum of absolute values of the relative level differences is increased in each delay amount.

4. The polar modulation transmission circuit according to claim 1, wherein the phase compensation section sets an optimum value as the delay amount based on a power level of a first delay amount and a power level of a second delay amount in the high-frequency band and the low-frequency band.

5. The polar modulation transmission circuit according to claim 1, wherein the phase compensation section includes: a plurality of tables in each of which the amplitude signal and the phase compensation amount are stored while the amplitude signal and the phase compensation amount are correlated with each other, the tables corresponding to the compensation characteristics, respectively;

a selection section that selects the table indicating the determined compensation characteristic from the plurality of tables; and an adding section that adds the phase compensation amount corresponding to the phase signal in the selected table to the phase signal.

6. The polar modulation transmission circuit according to claim 1, wherein the phase compensation section includes: a selection section that outputs a correction factor, which is multiplied by the amplitude signal, based on the determined correction characteristic;

a multiplying section that multiplies the correction factor by the amplitude signal, and outputs a multiplication result as the phase compensation amount corresponding to the amplitude signal; and an adding section that adds the phase compensation amount to the phase signal.

7. The polar modulation transmission circuit according to claim 1, wherein the phase compensation section includes: a plurality of tables in each of which the amplitude signal and the phase compensation amount are stored while the amplitude signal and the phase compensation amount are correlated with each other, the tables corresponding to the compensation characteristics, respectively;

a selection section that selects the table indicating a characteristic close to the determined compensation characteristic from the plurality of tables, and outputs a correction factor correcting the phase compensation amount corresponding to the amplitude signal in the compensation characteristic based on a relationship between the relative level difference and the delay amount;

a multiplying section that multiplies the correction factor by the phase compensation amount corresponding to the amplitude signal in the selected table, and outputs a multiplication result as the phase compensation amount corresponding to the amplitude signal; and an adding section that adds the phase compensation amount to the phase signal.

* * * * *